United States Patent
Schaerrer

(10) Patent No.: US 9,234,918 B2
(45) Date of Patent: Jan. 12, 2016

(54) CLOSED-LOOP CURRENT TRANSDUCER WITH SWITCHED MODE AMPLIFIER

(75) Inventor: Marc Schaerrer, Bernex (CH)

(73) Assignee: LEM Intellectual Property SA, Fribourg (CH)

( * ) Notice: Subject to any disclaimer, the term of this patent is extended or adjusted under 35 U.S.C. 154(b) by 105 days.

(21) Appl. No.: 13/876,413

(22) PCT Filed: Sep. 20, 2011

(86) PCT No.: PCT/IB2011/054112
§ 371 (c)(1),
(2), (4) Date: Mar. 27, 2013

(87) PCT Pub. No.: WO2012/038889
PCT Pub. Date: Mar. 29, 2012

(65) Prior Publication Data
US 2013/0241534 A1 Sep. 19, 2013

(30) Foreign Application Priority Data
Sep. 21, 2010 (EP) ..................................... 10178050

(51) Int. Cl.
*G01R 15/20* (2006.01)
*G01R 15/18* (2006.01)

(52) U.S. Cl.
CPC ............ *G01R 15/202* (2013.01); *G01R 15/185* (2013.01)

(58) Field of Classification Search
CPC ...... G01R 15/18; G01R 19/00; G01R 15/202; H01F 27/42; G06F 19/00
USPC .................. 324/117 H, 127, 126, 123 R, 664, 324/234–235, 247–249, 253, 158; 323/355, 323/356, 357, 358; 702/64
See application file for complete search history.

(56) References Cited

U.S. PATENT DOCUMENTS

| 6,411,078 B1* | 6/2002 | Nakagawa et al. ........ 324/117 H |
| 6,456,059 B1* | 9/2002 | Blakely ......................... 324/127 |
| 6,713,999 B1* | 3/2004 | Lenhard et al. ............ 324/117 R |

(Continued)

FOREIGN PATENT DOCUMENTS

| DE | 196 42 472 A1 | 4/1998 |
| DE | 102 04 424 C1 | 9/2003 |

(Continued)

OTHER PUBLICATIONS

International Search Report and Written Opinion issued by the European Patent Office, dated Dec. 1, 2011, for related International Application No. PCT/IB2011/054112; 13 pages.

*Primary Examiner* — Arleen M Vazquez
*Assistant Examiner* — Steven Yeninas
(74) *Attorney, Agent, or Firm* — Faegre Baker Daniels LLP

(57) ABSTRACT

A closed-loop current transducer for measuring a current (Ip) flowing in a primary conductor, the transducer powered by series connected voltage supplies (V_H, V_L) and comprising a magnetic field detector, a signal processing circuit including an amplifier circuit connected to the magnetic field detector, and a compensation coil (WS1) connected to the amplifier circuit and configured to generate an opposing magnetic field seeking to cancel a magnetic field generated by the current flowing in the primary conductor. The amplifier circuit comprises a first switched mode power stage configured to drive the magnetic field generator, and a second switched mode power stage configured to balance the currents of the voltage supplies.

15 Claims, 9 Drawing Sheets

(56) References Cited

U.S. PATENT DOCUMENTS

2004/0204875 A1 10/2004 Kopken
2006/0226826 A1* 10/2006 Teppan .................... 324/117 H
2011/0101975 A1* 5/2011 Popovic et al. ............... 324/251

FOREIGN PATENT DOCUMENTS

| EP | 0 686 850 A1 | 12/1995 |
| EP | 0 742 440 A2 | 11/1996 |
| WO | WO 98/36281 | 8/1998 |

* cited by examiner

CLOSED-LOOP CURRENT TRANSDUCER WITH SWITCHED MODE AMPLIFIER

BACKGROUND OF THE INVENTION

The present invention relates to a current transducer of the closed-loop type with a switched mode amplifier.

Certain known current transducers have a magnetic field detector and a magnetic circuit designed to surround a primary conductor through which a current to be measured flows, and to concentrate the magnetic field generated by the current flowing in the primary conductor. This magnetic field, which forms an image of the current to be measured, is sensed by the magnetic field detector. Open-loop current transducers generate a measurement signal from the magnetic field detector, whereas in closed-loop transducers the signal from the magnetic field detector is used to generate an opposing magnetic field by means of a compensation coil (also called secondary coil) that seeks to cancel the magnetic field generated by the primary conductor. In other words, closed-loop sensors have a feed-back signal that seeks to annul the magnetic field generated by the primary conductor. The current that flows in the compensation coil represents an image of the current to be measured and may thus be used to supply the current measurement signal. Closed-loop current transducers are generally more costly than open-loop current transducers for a given current measurement range, but have the advantage of greater sensitivity and accuracy. Magnetic field detectors employed in current transducers may be Hall effect detectors, magneto-resistive detectors or fluxgate detectors. Fluxgate detectors are generally more sensitive and accurate than Hall effect detectors.

In closed-loop transducers, the signal generated by the magnetic field detector needs to be processed and amplified in order to drive the compensation coil and provide the measurement signal output. In certain conventional current transducers, linear amplification circuits are employed, however linear amplifiers consume, dissipate and waste a relatively high amount of energy. For certain applications, particularly applications that require large current measurement as found in electrical motors for railways or in other high current applications, the transducer amplification circuit requires cooling means and a large volume in order to evacuate excess heat at the high operational temperatures.

Heat generation may be reduced by using more efficient amplifiers, in particular switched mode amplifiers such as the well-known H bridge amplifier circuits used in known closed-loop current transducers. An example of a known H bridge amplifier for a current transducer is described for example in WO 9836281. This type of amplifier is however generally more costly than linear amplifiers of comparable power, may require a split compensation coil, and generates a differential output voltage that is less useful or less desirable than an absolute measurement output (i.e. with respect to ground (0 Volts)).

BRIEF SUMMARY OF THE INVENTION

Considering the aforegoing, it is an object of this invention to provide a current transducer that is compact and has low power consumption.

It is advantageous to provide a current transducer that is economical yet accurate.

It is advantageous to provide a current transducer that has an output referred to ground or other reference voltage.

It is advantageous to provide a current transducer that can measure electrical currents over a large operating range, including high amplitude currents. It is further advantageous for such a transducer to have a current output.

Objects of this invention have been achieved by providing a closed-loop current transducer system according to claim 1.

Disclosed herein is a closed-loop current transducer system comprising a magnetic field detector, a signal processing circuit including an amplifier circuit connected to the magnetic field detector, and a compensation coil, connected to the amplifier circuit and configured to generate an opposing magnetic field seeking to cancel a magnetic field generated by a primary conductor through which a current to be measured flows. The amplifier circuit comprises a tint switched mode power stage configured to drive the compensation coil, and a second switched mode power stage configured to output a balancing current.

The transducer system is powered by series connected voltage supplies (V_H, V_L), the first switched mode power stage being fed by the voltage supplies and configured to supply an output current for a measurement resistor connected to a first reference voltage, where the voltage across the measurement resistor provides an image of the current flowing in the primary conductor, and whereby the second switched mode power stage is also fed by the voltage supplies and has an output connected to a second reference voltage through an inductor and configured to output the balancing current, whereby the first and second reference voltages may be the same or different. The second switched mode power stage is independently regulated from the first switched mode power stage, whereby control of the second switched-mode power stage is configured to act in way that does not depend on the magnetic field detector signal controlling the first power stage (i.e. to be independent of the field detector signal controlling the first power stage). This allows to balance the load of the voltage supplies (V_H and V_L), thus avoiding the build-up of excessive voltages on one or both of those power supplies. Independent regulation of the switched mode power stage may be achieved by providing the output of second switched mode power stage with its own regulation loop.

The balancing current may have an amplitude between 0.1 and 1.5 times but preferably between 0.7 and 1.2 the current output of the first power stage, but of opposite sign. The first switched mode power stage is configured for connection to a first reference voltage, preferably ground, and the second switched mode power stage is also configured for connection to a second reference voltage such as ground via at least an inductor. The first and second reference voltages may be at the same voltage, or may be at different voltages.

In an embodiment, the first switched mode power stage comprises a modulator, one or more drivers, and a single half bridge circuit. In this embodiment, the second power stage also comprises a modulator, one or more drivers, and a single half bridge amplifier circuit. The modulator and drivers of the first and second power stages may be identical or essentially identical.

A resistor may be connected to the second power stage.

In an embodiment, the magnetic field detector includes a fluxgate inductor and associated oscillator with an output used to regulate the first power stage output and therefore the compensation current.

In an embodiment, the magnetic field detector advantageously comprises a first fluxgate inductor and optionally a second fluxgate inductor, the first fluxgate inductor being connected to the first switched mode power stage and configured for use in the regulation circuit and driven by a self oscillating circuit. The optional second fluxgate inductor is driven with the opposite signal as the first fluxgate inductor to generate a magnetic flux opposed to the magnetic flux generated by the first fluxgate inductor. This allows to drastically reduce the noise induced by the fluxgate inductors in the primary and compensation currents.

The above described configuration advantageously allows the amplifier circuit to generate balanced or almost balanced supply currents that are always of the same positive sign. It also allows the measurement signal to be measured with respect to a fixed referenced voltage such as ground (0 Volts) thus providing an absolute measurement signal output. The switched mode power stages significantly reduce power consumption as compared to linear amplifiers thus obviating the need for a cooling system such as a large heatsink, leading to reduced weight and size of the transducer. Also, as the supply currents are largely reduced and balanced, there is less installed power required to supply the transducer. The invention configuration allows to take advantage of a switched mode power stage while at the same time generating a bipolar current output which enables connection of the measuring resistor to ground and which is particularly advantageous for high precision measurement.

In an embodiment, the second power stage is connected to the first power stage via a summing circuit comprising resistors, differential amplifiers and a regulation circuit, to control (regulate) the current in the second power stage. Within the scope of the invention, it is however possible to use other means to measure the current outputs of the first and second power stages to regulate the current of the second power stage, for example by means of current sensors, isolated or not, or other electronic circuits to regulate the current in the second power stage.

In a variant, the amplifier circuit may include a differential current transducer configured to sense a difference between supply currents of the voltage supplies and connected to a regulation circuit, such as a PT controller (proportional-integral controller), also known as a PI regulator, that controls the balancing current of the second switched power stage.

In another variant, the amplifier circuit may include a voltage sensing circuit configured to measure a reverse voltage across diodes on the voltage supplies, and a circuit configured to regulate the balancing current to decrease the current loading the capacitors on the voltage supplies. The regulation circuit may comprise a regulator and differential amplifiers connected to the regulator, configured to measure the reverse voltage on the diodes, and to regulate these reverse voltages within a defined band, for instance between 0 and 5 volts.

It may be noted that the amplitude of the output current of the second power stage does not need to be strictly equal to the amplitude of the output current of the first power stage, but could lie in the range of 0.1 to 1.5 times the amplitude of the output current of the first power stage, however of opposite sign. A factor of 1 will achieve the best balance of the supply currents while a lower factor such as 0.5 will reduce the losses in the second power stage at the price of some imbalance of the supply current. The factor may depend on first power stage output current, which provides the compensation coil current Is, or other system parameters like the supply voltages, other loads connected to the supply voltages or, the ability of some part of the circuit to absorb energy. Preferably, the second switched mode power stage is configured to output a balancing current of an amplitude between 0.7 and 1.2 times the current output of the first power stage, but of opposite sign.

In an advantageous embodiment, the current in the compensation coil provides a current output employed as a measurement signal output for the transducer, to which an external measuring resistor connected to ground (or another reference voltage) is connected. Within the scope of the invention, the measuring resistor may also be integrated in the transducer and the measurement signal of the transducer provided as a voltage output.

Further objects and advantageous aspects of the invention will be apparent from the claims and the detailed description of embodiments of the invention described hereafter, in relation to the annexed drawings.

DETAILED DESCRIPTION OF EMBODIMENTS OF THE INVENTION

Figure 1:
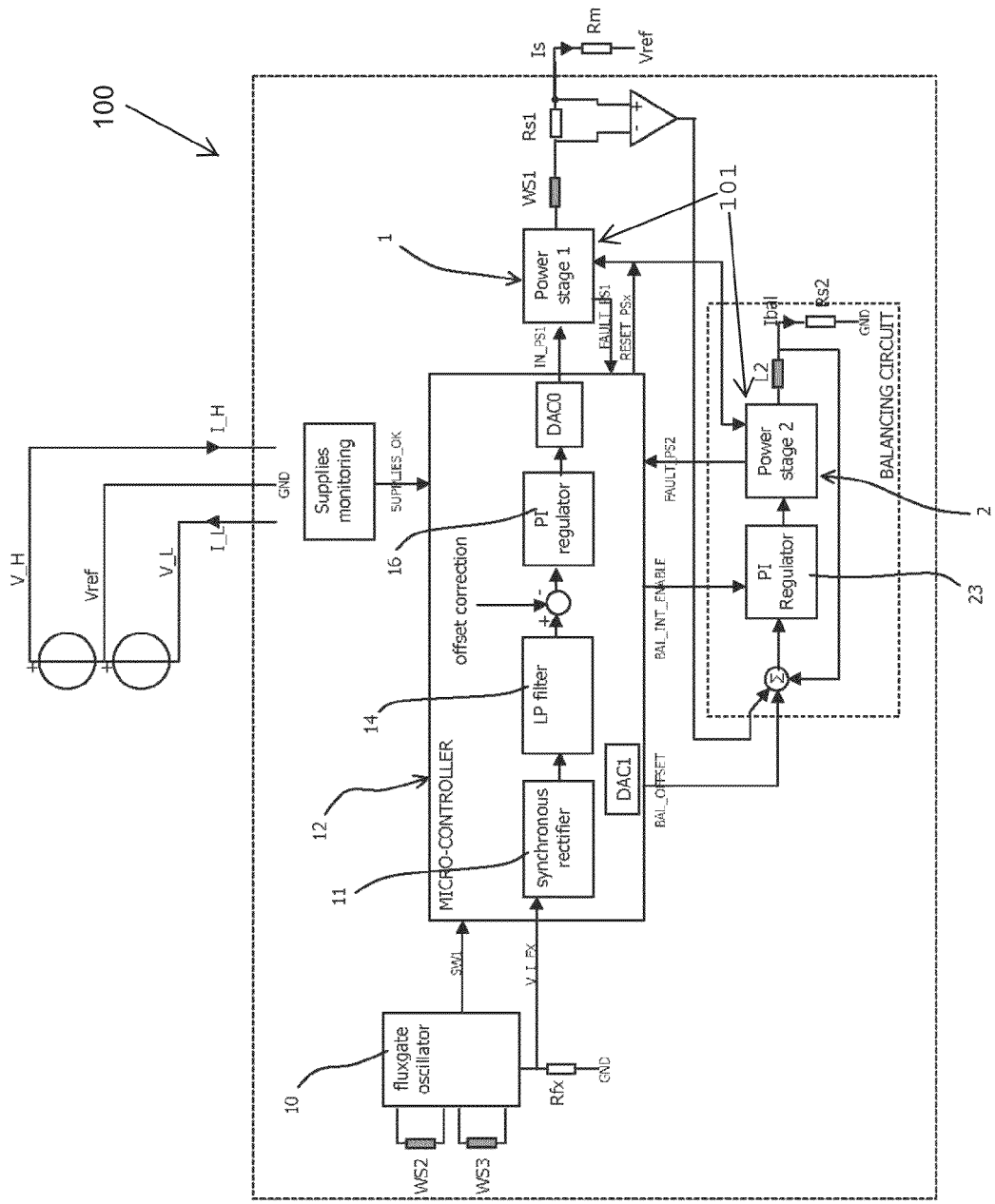
FIG. 1 is a block diagram illustrating a current transducer according to an embodiment of this invention.
Figure 3:
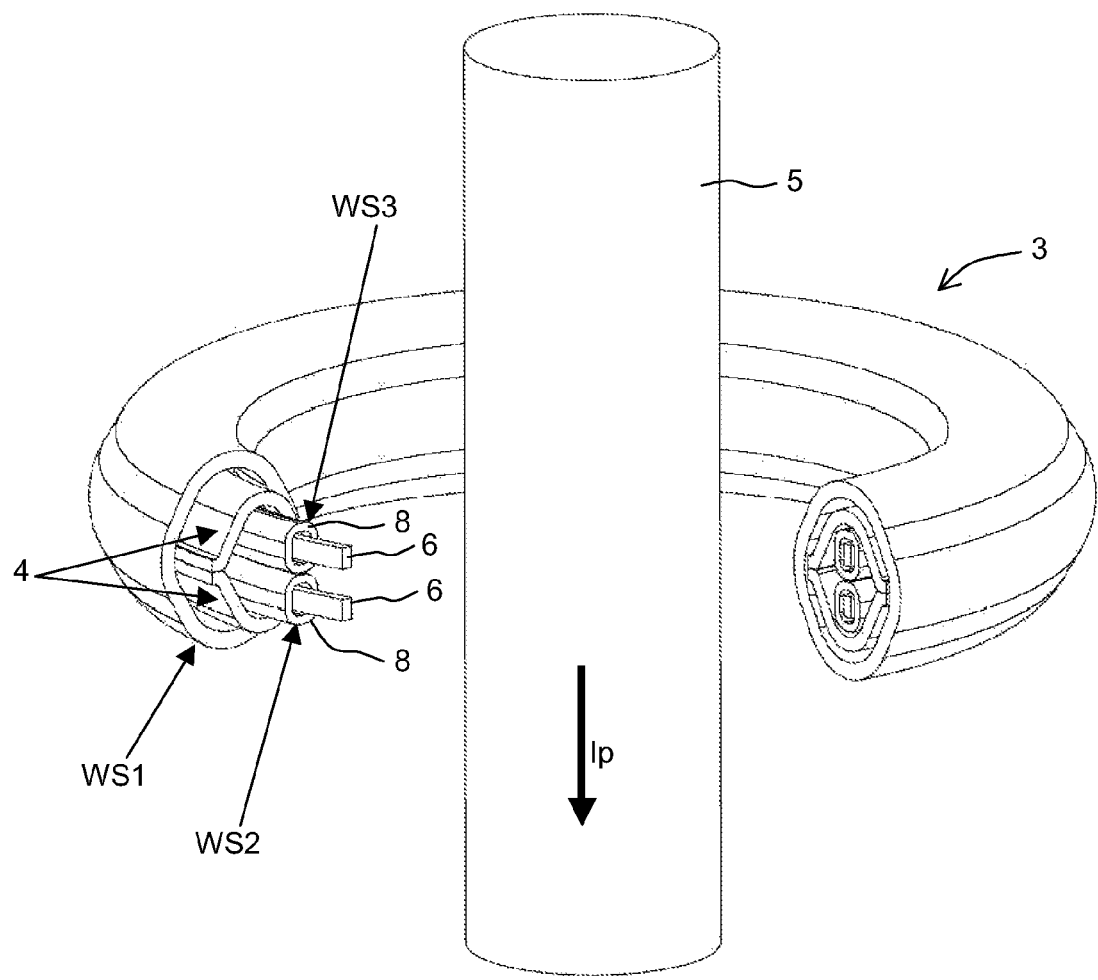
FIG. 3 is a perspective cross-sectional view of an embodiment of a measuring head of a current transducer according to this invention.
Figure 9:
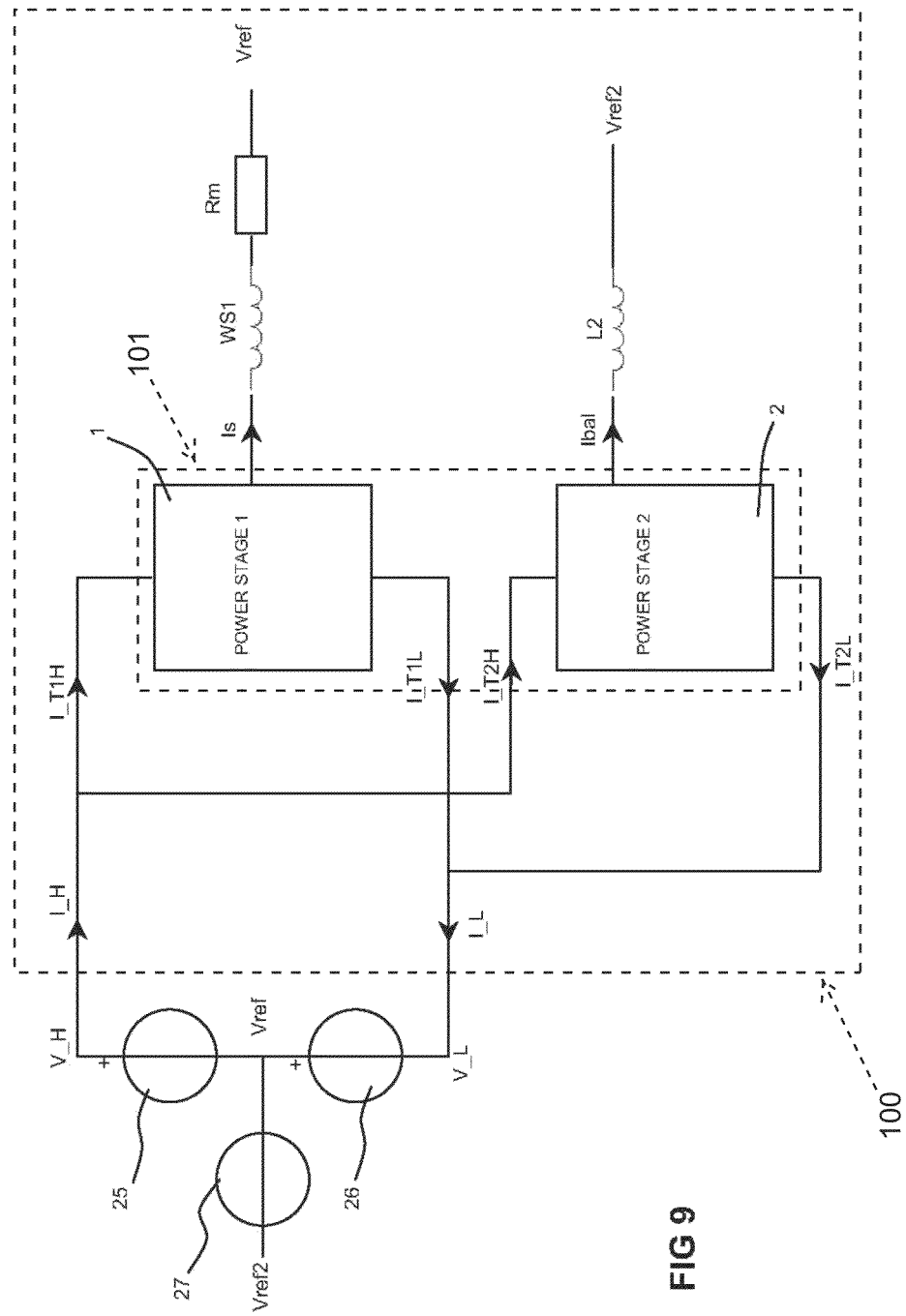
FIG. 9 is a block diagram illustrating a general configuration of a current transducer according to an embodiment of this invention.

Referring to the figures, in particular FIGS. 1, 3 and 9, a closed-loop current transducer system for measuring a current Ip flowing in a primary conductor 5 comprises a measuring head 3 and a signal processing circuit 100 powered by series connected voltage supplies V_H, V_L. The measuring head comprises a magnetic field detector and a compensation coil WS1. The signal processing circuit includes an amplifier circuit 101 connected to the magnetic field detector configured to generate an opposing magnetic field seeking to cancel a magnetic field generated by the current flowing in the primary conductor. The amplifier circuit comprises a first switched mode power stage fed by the voltage supplies V_H, V_L and configured to drive the compensation coil WS1 and supply a compensation coil current Is for a measurement resistor Rm connected to a first reference voltage Vref. The voltage across the measurement resistor provides an image of the current Ip flowing in the primary conductor 5. The amplifier circuit 101 includes at least a second independently regulated switched mode power stage 2 fed by the voltage supplies V_H, V_L with an output connected to a second reference voltage Vref2 through an inductor L2 and configured to output a balancing current Ibal. It may be noted that the first and second reference voltages may be the same, or they may be at a different potential. The mid point of the series connected voltage supplies V_H, V_L is preferably connected to the first reference voltage Vref.

Referring in particular to FIG. 3, in an embodiment the magnetic field detector of the measuring head 3 comprises a first annular fluxgate inductor WS2 and a second annular fluxgate inductor WS3 enclosed in a magnetic shield 4. The measuring head further includes a compensation coil WS1 wound around the magnetic shield 4. The measuring head has a central passage to allow a primary conductor 5S through which a current to be measured Ip flows, to pass therethrough. It may be noted that the primary conductor may be separately inserted through the passage or be provided as a conductor section that is preassembled to form an integral part of the transducer.

Each fluxgate inductor has a core 6 made of a material with a high magnetic permeability, surrounded by a fluxgate inductor coil 8 connected to a fluxgate oscillator circuit 10 that is configured to generate an alternating current that alternatingly saturates the cores. Each core 6 may for instance be in the form of a ring made of one or several turns of amorphous ribbon. It should be noted that only one fluxgate inductor is required for the magnetic field detector to function. The second fluxgate inductor is optional, and has the advantage of reducing noise induced by the fluxgate inductors in the compensation coil and primary conductor.

One fluxgate inductor WS2 is used as flux detector for regulation of a compensation coil WS1 that seeks to cancel the magnetic field generated by the current Ip of the primary conductor and acting on the fluxgate inductors WS2, WS3. In the embodiment illustrated, the compensation coil WS1 is wound around the fluxgate inductors WS2, WS3.

Figure 2:
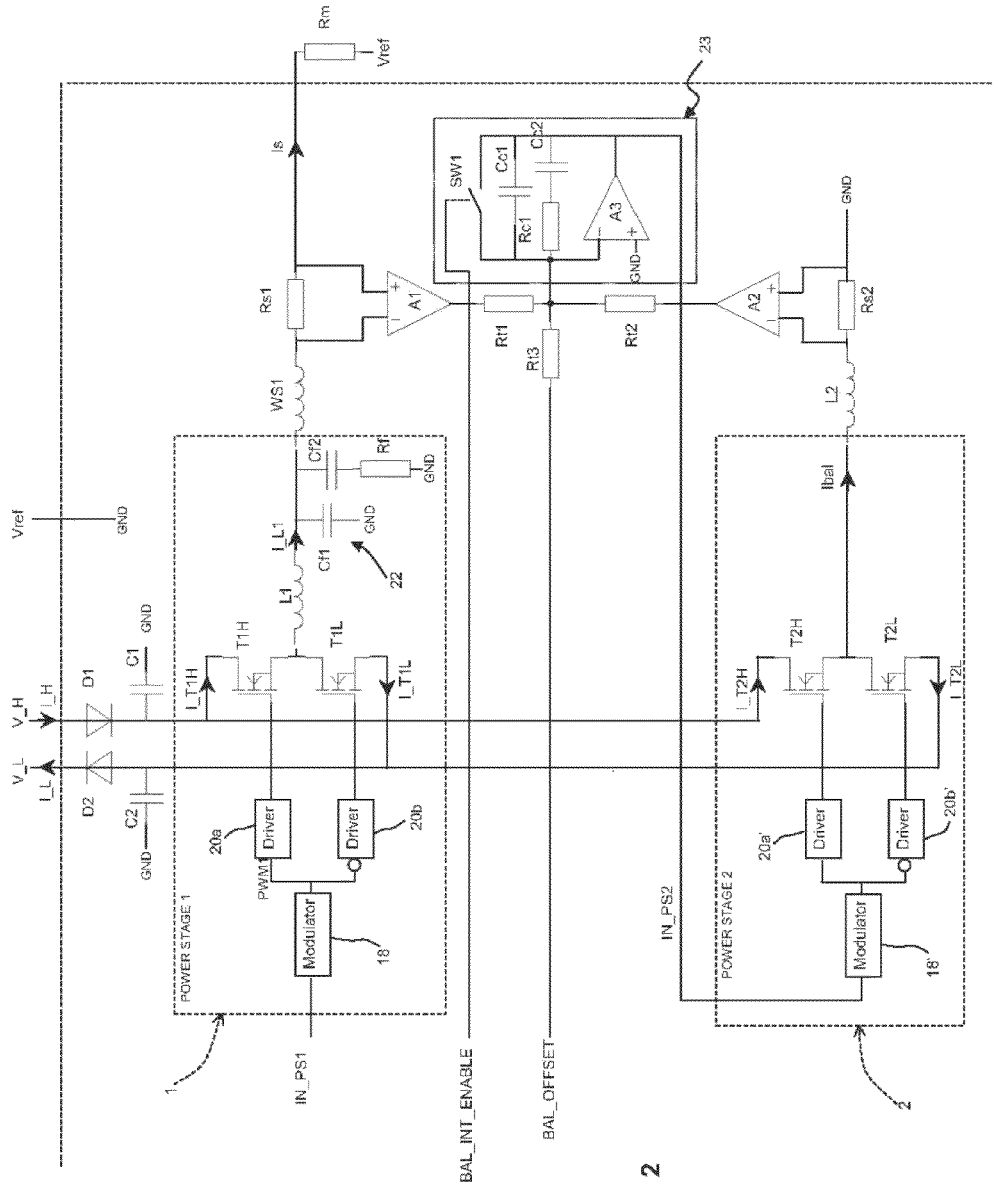
FIG. 2 is a simplified circuit diagram of the power stages of a current transducer according to an embodiment of this invention.

Referring in particular to FIGS. 1 and 2, the fluxgate inductor WS2 may be driven by a self-oscillating circuit such as a known H-bridge circuit and the current in the fluxgate inductor coil 8 provides a measurement signal that may be used to determine the compensation current to be fed to the compensation coil WS1. Referring in particular to FIG. 1, the compensation signal may be passed through a synchronous rectifier 11, filtered through a low-pass filter 14 and fed into a PI regulator 16 and digital to analogue converter DAC0 of a microcontroller 12. A resulting signal (IN_PS1) provides a control value for a power stage amplifier—switched mode power stage 1—that drives the compensation coil WS1. The synchronous detection, the filtering and the regulation circuit may be made in the microcontroller 12.

The optional second fluxgate inductor WS3 may be driven with essentially the opposite signal as the first fluxgate inductor WS2 to generate a magnetic flux opposed to the magnetic flux generated by the first fluxgate inductor WS2. This reduces the noise induced by the fluxgate inductors in the primary and compensation currents.

Referring to FIG. 2, switched mode power stage 1 may advantageously be a class D amplifier comprising a modulator 18, drivers 20a, 20b, a single half bridge with first and second transistors T1H,T1L, and a low pass filter 22. The switched mode power stage 1 drives the compensation coil WS1, sense resistor Rs1 and measuring resistor Rm. The modulator 18 converts the analogue input voltage into a pulse width modulated digital signal PWM1 (fixed or variable frequency, preferably high frequency to limit the size of the filter 22). The low pass filter 22 (L1, Cf1, Cf2, Rf) is used to reduce the harmonic content of the power stage output voltage and therefore from the compensation current. The resistance Rf of the low pass filter is used to dampen the oscillations of the filter. Several protections such as overcurrent, undervoltage, and overtemperature protections may also be included but are not represented in order to simplify the representation. These circuit protections are however known per se and need not be further described herein.

The circuit includes a second class D amplifier—switched mode power stage 2—that may advantageously have a similar circuit diagram as switched mode power stage 1, except it has no filter. Power stage 2 may thus include a modulator 18', drivers 20a, 20b, and a single half bridge with first and second transistors T2H,T2L. The modulator converts the analogue input voltage IN_PS2 into a pulse width modulated digital signal PWM2 (fixed or variable frequency, high frequency compared to the time constant of L2 and Rs2). Switched mode power stage 2 drives an inductor L2 and a sense resistor Rs2 connected to the mid-point of the voltage supplies reference voltage GND. The current Ibal output from switched mode power stage 2 is regulated to have an equal amplitude but opposite sign to the compensation coil current Is output from switched mode power stage 1.

In the embodiment illustrated in FIG. 2, the regulation of the second switched mode power stage uses sense resistors Rs1, Rs2 and differential amplifiers A1 and A2 to sense the output currents of both switched mode power stages and a summing circuit comprising circuit elements Rt1, Rt2, A3, Rc1, Cc1, Cc2 to sum the currents and realize a PI regulator that ensures good regulation of the balancing current Ibal and a stable regulation loop.

BAL_INT_ENABLE and SW1 inputs are used to start smoothly the regulation circuit. The integrator is started (switch SW1 open) only when switched mode power stage 2 is operating. This avoids overshoots on the balancing current Ibal at start-up.

The combination of both switched mode power stages 1 and 2 results in almost balanced supply currents I_H, I_L. The difference of the equivalent load resistance of the two power stages may cause minor imbalances in the supply currents because the duty cycles of PWM1 and PWM2 are not exactly the same. A small error in the regulation of the second switched mode power stage 2 also results in a slight imbalance of the supply currents, however whatever the value of Is the supply currents I_H, I_L do not change direction and remain non-zero as there are losses that cause non-zero no-load I_H and I_L currents. The balance of the supply currents I_H, I_L can be easily adjusted during the production of the transducer to compensate an offset of the regulation circuit 23 or amplifiers A1, A2 by changing the voltage of an offset control signal BAL_OFFSET supplied by the microcontroller 12 via a digital analogue converter DAC1. The losses of both switched mode power stages and sense resistors Rs1, Rs2 are much lower than if the amplifier were of the linear type. There is as a result no need for a cooling system such as a large heatsink.

For easy manufacturing both inductors L1 and L2 of the first and second switched mode power stages 1, 2 may be identical. The sense resistor of second switched mode power stage Rs2 may have a low resistance value to keep its losses as low as possible and preferably has the same resistance value as the sense resistor Rs1 of first switched mode power stage. The reduction of the value of Rs1 and Rs2 is only limited by the offset of differential amplifiers A1 and A2 which are used to measure the output currents of the first and second switched mode power stages to allow the regulation of the output current Ibal of the second switched mode power stage.

It is however possible to use other means to measure the current output of the first switched mode power stage to regulate the current of the second switched mode power stage, for example by means of current sensors, isolated or not, or other electronic circuits to regulate the current in the second switched mode power stage.

Figure 7:
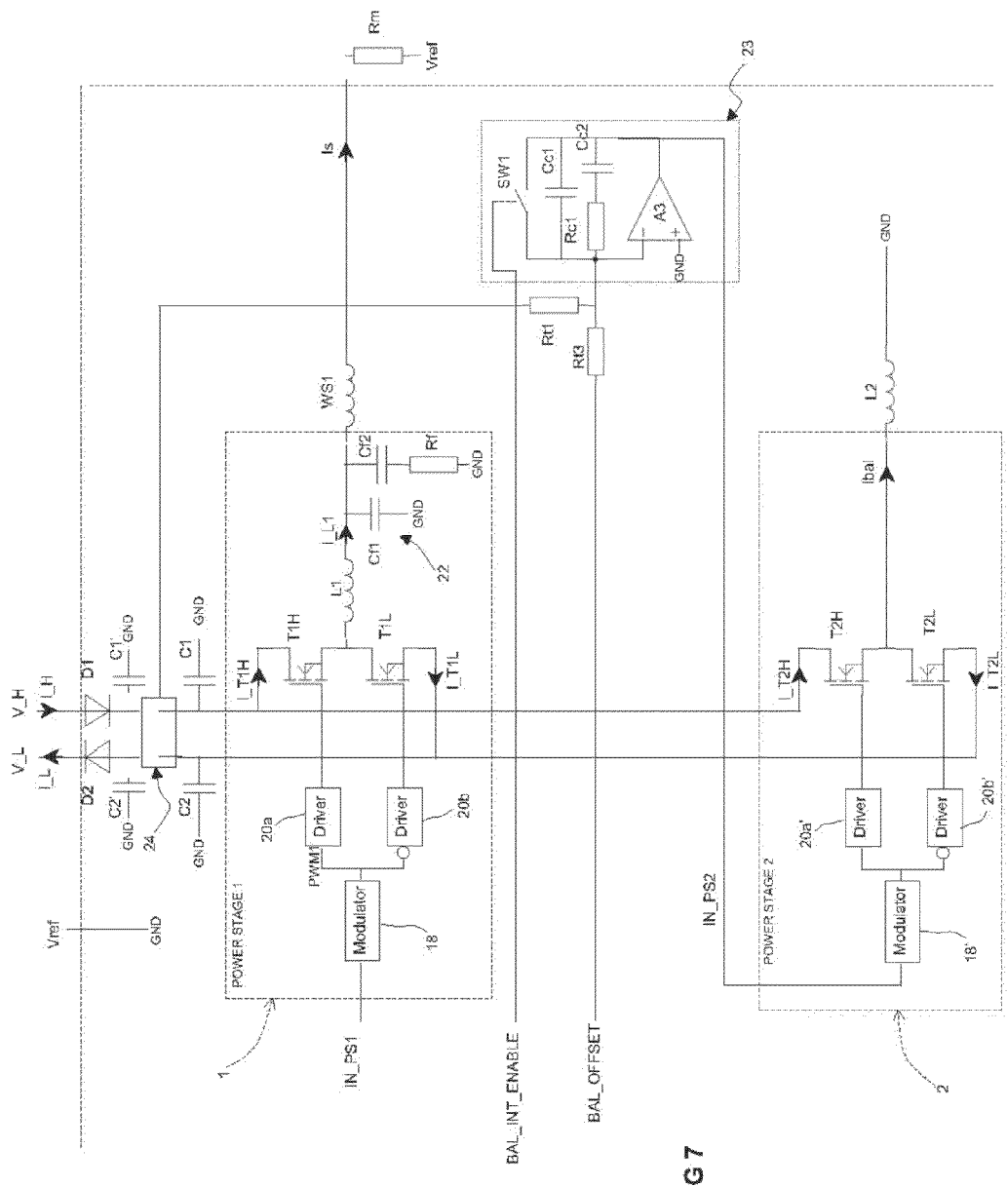
FIG. 7 is a simplified circuit diagram of the power stages of a current transducer according to an embodiment of this invention.

In the embodiment illustrated in FIG. 7, the regulation of the second power stage uses a differential current transducer 24 to sense the difference between the supply currents I_L, I_H and a regulation circuit comprising circuit elements Rt1, A3, Rc1, Cc1, Cc2 to realize PI regulator that ensures good regulation of the balancing current Ibal and a stable regulation loop. When there is no difference between I_L and I_H (i.e when they are equal), the balancing current Ibal is equal to or approximately equal to the negative value of the first power stage output current −Is. The differential current transducer could also be realized by sense resistors and differential amplifiers or other electronic circuits.

Figure 8:
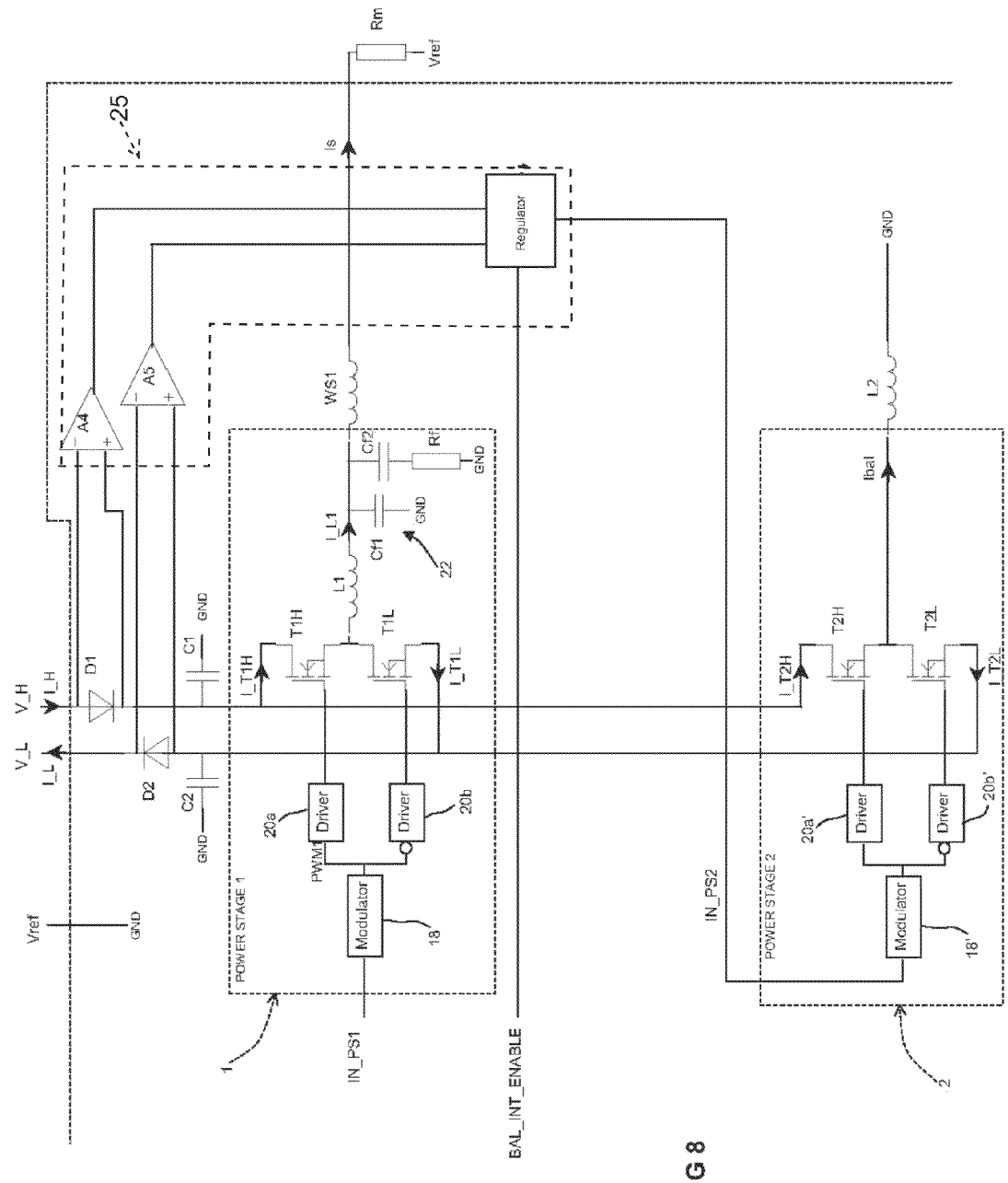
FIG. 8 is a simplified circuit diagram of the power stages of a current transducer according to another embodiment of this invention.

In the embodiment illustrated in FIG. 8, the regulation circuit comprises a regulator 25 and differential amplifiers A4, A5 connected to the regulator 25. The regulation of the current in the second switched mode power stage uses the reverse voltage across first and second diodes D1 and D2. An increase of the reverse voltage across the first diode D1 indicates that there is current loading first capacitor C1 and that the balancing current Ibal should be regulated (in this case a positive current) to decrease the current loading the first capacitor C1. Accordingly, an increase of the reverse voltage across second diode D2 indicates that there is current flowing into second capacitor C2 and that the balancing current Ibal should be regulated (in this case a negative current) to decrease the current flowing into C2. The differential amplifiers A4, A5 measure the reverse voltage on diodes D1 and D2, and the regulator 25 regulates these reverse voltages within a defined band, for example 0 to 5 volts, by changing the second switched mode power stage input IN_PS2.

Figure 4:
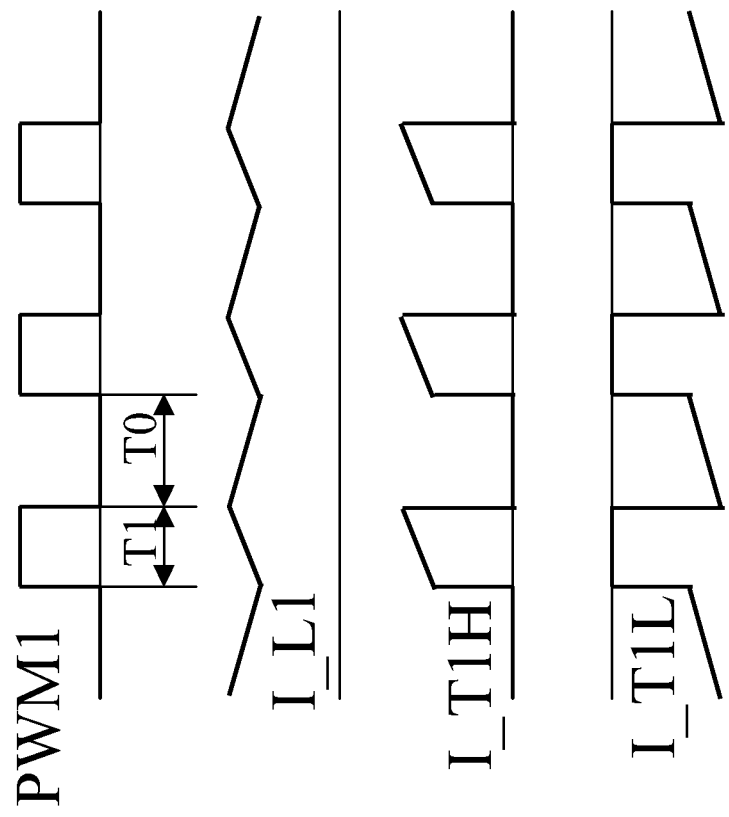
FIG. 4 is a simplified graphical illustration of input and output signals in a switched mode power stage of an amplifying circuit of an embodiment of a transducer according to this invention.
Figure 5:
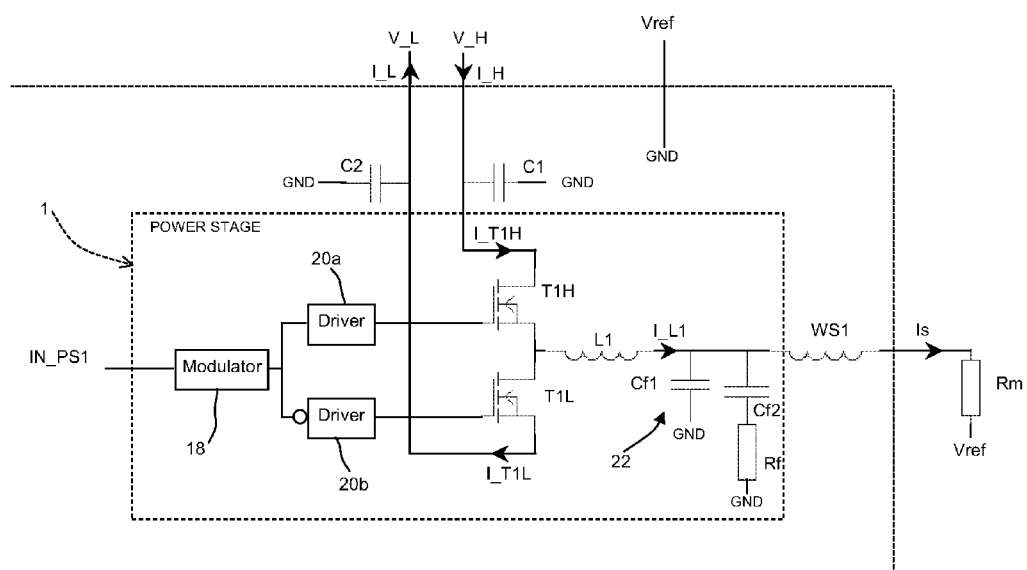
FIG. 5 is a simplified circuit diagram of the power stage of a current transducer with one single switched mode power stage.
Figures 6A, 6B:
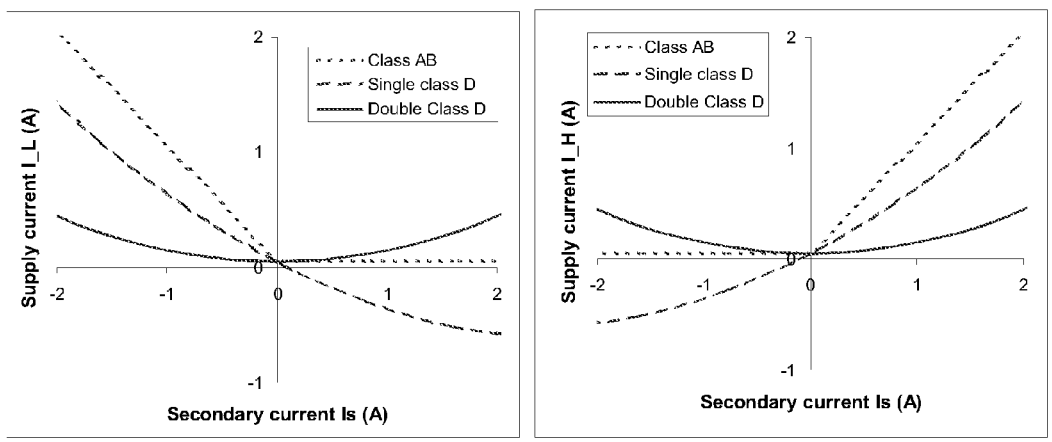
FIGS. 6a and 6b show of the supply currents I_L and I_H as a function of the compensation current Is of a 4000 A/2500 turns current transducer with a Class AB power stage ("Class AB" curve), with a single switched mode power stage (curve "Single Class D") or with two switched mode power stages according to this invention (curve "Double Class D") where Ibal=−Is.

The advantage of the two balanced switched mode power stages may be better understood by understanding the problem of a system with only one switched mode power stage (see FIG. 5). In such case let us assume that the power stage output compensation coil current Is is a DC current greater than zero, then the current I_L1 in the filter is greater than zero and approximately constant during a switching period because L1 inductance has a large value (see FIG. 4). The transistor T1H current I_T1H is either positive or null and the average is therefore greater than zero which results in a supply current I_H greater than zero (see FIG. 4). Explanation: I_T1H=I_L1 when T1H is on (that is PWM1=1), I_T1H=0 when T1H is off (PWM1=0). However, under the same conditions, the transistor T1L average current I_T1L is less than zero, which means the supply current I_L is less than zero (see FIGS. 6a and 6b, curves "Single Class D"). Explanation: I_T1L=−I_L1 when T1L is on (i.e. PWM1=0), I_T1L=0 when T1L is off (i.e. PWM1=1). This is a problem because it means that the voltage power supply which supplies V_L has to absorb power. Only specially designed power supplies can absorb power, and it also prohibits the use of diodes for polarity reversal protection.

A circuit with two switched mode power stages as proposed in the present invention (see FIGS. 2 and 9), however allows to balance the system by generating an opposite current Ibal of equal amplitude (or approximately equal) but opposite sign to the first power stage output compensation coil current Is (Ibal=−Is). Under these conditions, the average transistor current I_T2H is less than zero and average transistor current I_T2L is greater than zero when Is is greater than zero and therefore Ibal less than zero. The current I_T2L of the transistor T2L of the second power stage will therefore compensate the negative value of the current I_T1L of the transistor T1L of the first power stage, and the current I_T1H of the transistor T1H of the first switched mode power stage 1 will compensate the negative value of the current I_T2H of the transistor T2H of the second switched mode power stage 2, resulting in the supply currents I_H, I_L not changing direction (i.e remaining always positive in the sense of power generation of the voltage supplies V_H, V_L, as opposed to power absorption of the supplies) and in fact never becoming quite zero because there are losses in the circuit. In view of the losses, both voltage supplies V_H and V_L provide power to the transducer such that the supply currents I_H, I_L remain positive as illustrated by the curves entitled "Double Class D" shown in FIGS. 6a and 6b. Moreover, there is no problem using, or not using, polarity reversal protection diodes D1 and D2.

It may be noted that the amplitude of the output current of the second switched mode power stage does not need to be strictly equal to the amplitude of the output current of the first switched mode power stage, but could lie in the range of 0.1 to 1.5 times the amplitude of the output current of the first power stage, however of opposite sign. Preferably the amplitude of the output current of the first power stage lies in the range of 0.7 to 1.2 times the amplitude of the output current of the first power stage. It is of interest to reduce the balancing current to reduce the losses of the second power stage. The reduction should not allow any of the supply current to become negative to avoid the rise of a supply voltage. Preferably however, the amplitude of the output currents of both switched mode power stages will be almost identical to achieve a good balancing of the currents in the voltage supplies I_L, I_H.

The signal RESET_PSx allows to start and stop both switched mode power stages. The signals FAULT_PS1 and FAULT_PS2 between the switched mode power stages and the microcontroller are logic signals that indicate if first or second switched mode power stages 1,2 has stopped because a protection was triggered (overcurrent, undervoltage, overtemperature or other). If one of the switched mode power stages stops operating, it is important to stop the other switched mode power stage to prevent an overvoltage on the first or second capacitor C1,C2 because of a negative supply current.

Advantages of the present invention are:
Losses of the amplifier circuit are drastically reduced thanks to switched mode power stages (for example from 30 W (Class AB power stage) to 5 W (Class D power stage with balancing) for a 4000 A/2500 turns current transducer at nominal conditions)
The proposed circuit allows to take advantage of a switched mode power stage and at the same time of a bipolar current output. The ability to connect the measuring resistor Rm to ground remains, which is very advantageous for high precision sensors.
Compared to a Class AB power stage, supply currents are largely reduced and always balanced, which means less installed power to supply the transducer (typically from ±1.7 A to ±0.3 A for the same transducer and conditions as above) (see FIGS. 6a and 6b, curves "Class AB" and "Double Class D").
There is no need for an external and large heatsink, which leads to reduced weight and size of transducer, but also allows the transducer to operate at higher ambient temperatures.

The invention claimed is:
1. A closed-loop current transducer system for measuring a current (Ip) flowing in a primary conductor, the system powered by series connected voltage supplies and comprising a magnetic field detector, a signal processing circuit including an amplifier circuit connected to the magnetic field detector, and a compensation coil connected to the amplifier circuit and configured to generate an opposing magnetic field seeking to cancel a magnetic field generated by the current flowing in the primary conductor, characterised in that the amplifier circuit comprises a first switched mode power stage fed by the volt- age supplies and configured to drive the compensation coil and supply a compensation current to a measurement resistor connected directly to a first reference voltage (Vref), where the voltage across the measurement resistor provides non-differential measurement of the current flowing in the primary conductor, and at least a second independently regulated switched mode power stage fed by the voltage supplies with an output connected to a second reference voltage through an Inductor and configured to output a balancing current, whereby the first and second reference voltages are the same or different.

2. Current transducer system according to claim 1, wherein the second switched mode power stage is configured to output the balancing current of an amplitude between 0.1 and 1.5 times the compensation current output, but of opposite sign.

3. Current transducer system according to claim 2, wherein the second switched mode power stage is configured to output the balancing current (Ibal) of an amplitude between 0.7 and 1.2 times the compensation current output, but of opposite sign.

4. Current transducer system according to claim 1, wherein the second switched mode power stage is configured to output the balancing current (Ibal) which flows into the reference voltage (Vref, Vref2).

5. Current transducer system according to claim 1, wherein the first switched mode power stage comprises a modulator, one or more drivers, and a single half bridge circuit.

6. Current transducer system according to claim 1, wherein the second switched mode power stage comprises a modulator, one or more drivers, and a single half bridge circuit, where the modulator and drivers are identical or essentially identical for both first and second power stages.

7. Current transducer system according to claim 1, wherein the magnetic field detector includes a fluxgate inductor with an output processed and connected to a modulator of the first switched mode power stage.

8. Current transducer system according to claim 1, wherein the magnetic field detector comprises a first fluxgate inductor and a second fluxgate inductor, the first fluxgate output being connected to the first switched mode power stage via the signal processing circuit.

9. Current transducer system according to claim 8, wherein the first fluxgate inductor is driven by a self-oscillating circuit and configured to generate a signal used to determine a compensation current driving the compensation coil.

10. Current transducer system according to claim 1, wherein the second switched mode power stage is connected to the first switched mode power stage via a summing circuit comprising resistors, differential amplifiers and a regulation circuit to regulate the current in the second switched mode power stage.

11. Current transducer system according to claim 1, wherein the amplifier circuit comprises a differential current transducer configured to sense a difference between supply currents (I_L, I_H) of the voltage supplies and connected to a regulation circuit that regulates the balancing current Ibal of the second switched power stage.

12. Current transducer system according to claim 10 or 11 wherein the regulation circuit comprises a PI regulator.

13. Current transducer system according to claim 1, wherein the amplifier circuit comprises a voltage sensing circuit configured to measure a reverse voltage across diodes on the voltage supplies, and a regulator configured to regulate the balancing current (Ibal) to decrease a current loading of capacitors on the voltage supplies.

14. Current transducer system according to claim 13 wherein the regulation circuit comprises a regulator and differential amplifiers connected to the regulator configured to measure the reverse voltages on the diodes, the regulation circuit being configured to regulate said reverse within a defined band.

15. Current transducer system according to claim 14 wherein the defined band is between 0 and 5 volts.

* * * * *